US009076843B2

(12) United States Patent
Lee et al.

(10) Patent No.: US 9,076,843 B2
(45) Date of Patent: Jul. 7, 2015

(54) METHOD FOR PRODUCING ULTRA-THIN TUNGSTEN LAYERS WITH IMPROVED STEP COVERAGE

(71) Applicant: Novellus Systems, Inc., Fremont, CA (US)

(72) Inventors: Sang-Hyeob Lee, Fremont, CA (US); Joshua Collins, Sunnyvale, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/633,502

(22) Filed: Oct. 2, 2012

(65) Prior Publication Data
US 2013/0168864 A1    Jul. 4, 2013

Related U.S. Application Data

(63) Continuation-in-part of application No. 13/095,734, filed on Apr. 27, 2011, now Pat. No. 8,409,985, which is a continuation of application No. 12/030,645, filed on Feb. 13, 2008, now Pat. No. 7,955,972, which is a
(Continued)

(51) Int. Cl.
*H01L 21/44* (2006.01)
*H01L 21/768* (2006.01)
*H01L 23/52* (2006.01)
(Continued)

(52) U.S. Cl.
CPC .............. *H01L 21/768* (2013.01); *H01L 23/52* (2013.01); *C23C 16/0281* (2013.01); *C23C 16/045* (2013.01); *C23C 16/14* (2013.01); *C23C 16/45525* (2013.01); *H01L 21/28556* (2013.01);
(Continued)

(58) Field of Classification Search
CPC ................... H01L 21/76843; H01L 21/76877; H01L 21/28556; H01L 21/76856; H01L 21/28562; H01L 21/28518; H01L 29/665; H01L 21/76876; H01L 21/76855; H01L 21/76846; H01L 21/76879; C23C 16/14; C23C 16/45525; C23C 16/0281; C23C 16/45523
USPC .......................................... 438/648, 656, 685
See application file for complete search history.

(56) References Cited

U.S. PATENT DOCUMENTS

| | | |
|---|---|---|
| 4,746,375 A | 5/1988 | Iacovangelo |
| 4,804,560 A | 2/1989 | Shioya et al. |

(Continued)

FOREIGN PATENT DOCUMENTS

| | | |
|---|---|---|
| EP | 0 437 110 | 7/1991 |
| EP | 1 156 132 | 11/2001 |

(Continued)

OTHER PUBLICATIONS

Lee et al., PCT Search Report, Completed Oct. 15, 2004, PCT/US2004/006940, Int'l filing date May 3, 2004.
(Continued)

*Primary Examiner* — Michelle Mandala
(74) *Attorney, Agent, or Firm* — Weaver Austin Villeneuve & Sampson LLP

(57) ABSTRACT

A tungsten nucleation film is formed on a surface of a semiconductor substrate by alternatively providing to that surface, reducing gases and tungsten-containing gases. Each cycle of the method provides for one or more monolayers of the tungsten film. The film is conformal and has improved step coverage, even for a high aspect ratio contact hole.

18 Claims, 5 Drawing Sheets

Related U.S. Application Data continuation-in-part of application No. 11/265,531, filed on Nov. 1, 2005, now Pat. No. 7,589,017, which is a continuation-in-part of application No. 10/815,560, filed on Mar. 31, 2004, now Pat. No. 7,262,125, which is a continuation-in-part of application No. 10/649,351, filed on Aug. 26, 2003, now Pat. No. 7,141,494, which is a continuation-in-part of application No. 09/975,074, filed on Oct. 9, 2001, now Pat. No. 6,635,965.

(60) Provisional application No. 60/904,015, filed on Feb. 27, 2007, provisional application No. 60/292,917, filed on May 22, 2001.

(51) Int. Cl.
  C23C 16/02 (2006.01)
  C23C 16/04 (2006.01)
  C23C 16/14 (2006.01)
  C23C 16/455 (2006.01)
  H01L 21/285 (2006.01)

(52) U.S. Cl.
  CPC .... H01L 21/28562 (2013.01); H01L 21/76876 (2013.01); H01L 21/76877 (2013.01)

(56) References Cited

U.S. PATENT DOCUMENTS

| | | |
|---|---|---|
| 4,874,719 A | 10/1989 | Kuroawa |
| 5,028,565 A | 7/1991 | Chang et al. |
| 5,227,329 A | 7/1993 | Kobayashi et al. |
| 5,250,329 A | 10/1993 | Miracky et al. |
| 5,250,467 A | 10/1993 | Somekh et al. |
| 5,308,655 A | 5/1994 | Eichman et al. |
| 5,326,723 A | 7/1994 | Petro et al. |
| 5,370,739 A | 12/1994 | Foster et al. |
| 5,391,394 A | 2/1995 | Hansen |
| 5,567,583 A | 10/1996 | Wang et al. |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,833,817 A | 11/1998 | Tsai et al. |
| 5,913,145 A | 6/1999 | Lu et al. |
| 5,926,720 A | 7/1999 | Zhao et al. |
| 5,956,609 A | 9/1999 | Lee et al. |
| 5,994,749 A | 11/1999 | Oda |
| 6,001,729 A | 12/1999 | Shinriki et al. |
| 6,017,818 A | 1/2000 | Lu |
| 6,034,419 A | 3/2000 | Nicholls et al. |
| 6,037,263 A | 3/2000 | Chang |
| 6,066,366 A | 5/2000 | Berenbaum et al. |
| 6,099,904 A | 8/2000 | Mak et al. |
| 6,107,200 A | 8/2000 | Takagi et al. |
| 6,143,082 A | 11/2000 | McInerney et al. |
| 6,174,812 B1 | 1/2001 | Hsiung et al. |
| 6,206,967 B1 | 3/2001 | Mak et al. |
| 6,245,654 B1 | 6/2001 | Shih et al. |
| 6,265,312 B1 | 7/2001 | Sidhwa et al. |
| 6,277,744 B1 | 8/2001 | Yuan et al. |
| 6,294,468 B1 | 9/2001 | Gould-Choquette et al. |
| 6,297,152 B1 | 10/2001 | Itoh et al. |
| 6,309,966 B1 | 10/2001 | Govindarajan et al. |
| 6,310,300 B1 | 10/2001 | Cooney et al. |
| 6,355,558 B1 | 3/2002 | Dixit et al. |
| 6,404,054 B1 | 6/2002 | Oh et al. |
| 6,429,126 B1 | 8/2002 | Herner et al. |
| 6,465,347 B2 | 10/2002 | Ishizuka et al. |
| 6,551,929 B1 | 4/2003 | Kori et al. |
| 6,566,250 B1 | 5/2003 | Tu et al. |
| 6,566,262 B1 | 5/2003 | Rissman et al. |
| 6,581,258 B2 | 6/2003 | Yoneda et al. |
| 6,593,233 B1 | 7/2003 | Miyazaki et al. |
| 6,607,976 B2 | 8/2003 | Chen et al. |
| 6,627,066 B1 | 9/2003 | Isayama et al. |
| 6,635,965 B1 | 10/2003 | Lee et al. |
| 6,706,625 B1 | 3/2004 | Sudijono et al. |
| 6,720,261 B1 | 4/2004 | Anderson et al. |
| 6,740,221 B2 | 5/2004 | Cheung et al. |
| 6,740,585 B2 | 5/2004 | Yoon et al. |
| 6,777,331 B2 | 8/2004 | Nguyen |
| 6,797,340 B2 | 9/2004 | Fang et al. |
| 6,827,839 B2 | 12/2004 | Sonnenberg et al. |
| 6,844,258 B1 | 1/2005 | Fair et al. |
| 6,861,356 B2 | 3/2005 | Matsuse et al. |
| 6,902,763 B1 | 6/2005 | Elers et al. |
| 6,903,016 B2 | 6/2005 | Cohen |
| 6,905,543 B1 | 6/2005 | Fair et al. |
| 6,908,848 B2 | 6/2005 | Koo |
| 6,936,538 B2 | 8/2005 | Byun |
| 6,939,804 B2 | 9/2005 | Lai et al. |
| 6,962,873 B1 | 11/2005 | Park |
| 7,005,372 B2 | 2/2006 | Levy et al. |
| 7,141,494 B2 | 11/2006 | Lee et al. |
| 7,144,488 B2 | 12/2006 | Binstead et al. |
| 7,157,798 B1 | 1/2007 | Fair et al. |
| 7,211,144 B2 | 5/2007 | Lu et al. |
| 7,220,671 B2 | 5/2007 | Simka et al. |
| 7,235,486 B2 | 6/2007 | Kori et al. |
| 7,262,125 B2 | 8/2007 | Wongsenakhum et al. |
| 7,416,979 B2 | 8/2008 | Yoon et al. |
| 7,419,904 B2 | 9/2008 | Kato |
| 7,429,402 B2 | 9/2008 | Gandikota et al. |
| 7,465,665 B2 | 12/2008 | Xi et al. |
| 7,465,666 B2 | 12/2008 | Kori et al. |
| 7,501,343 B2 | 3/2009 | Byun et al. |
| 7,501,344 B2 | 3/2009 | Byun et al. |
| 7,563,718 B2 | 7/2009 | Kim |
| 7,589,017 B2 | 9/2009 | Chan et al. |
| 7,605,083 B2 | 10/2009 | Lai et al. |
| 7,611,990 B2 | 11/2009 | Yoon et al. |
| 7,655,567 B1 | 2/2010 | Gao et al. |
| 7,674,715 B2 | 3/2010 | Kori et al. |
| 7,675,119 B2 | 3/2010 | Taguwa |
| 7,691,749 B2 | 4/2010 | Levy et al. |
| 7,695,563 B2 | 4/2010 | Lu et al. |
| 7,709,385 B2 | 5/2010 | Xi et al. |
| 7,732,327 B2 | 6/2010 | Lee et al. |
| 7,745,329 B2 | 6/2010 | Wang et al. |
| 7,745,333 B2 | 6/2010 | Lai et al. |
| 7,749,815 B2 | 7/2010 | Byun |
| 7,754,604 B2 | 7/2010 | Wongsenakhum et al. |
| 7,772,114 B2 | 8/2010 | Chan et al. |
| 7,955,972 B2 | 6/2011 | Chan et al. |
| 7,977,243 B2 | 7/2011 | Sakamoto et al. |
| 8,048,805 B2 | 11/2011 | Chan et al. |
| 8,053,365 B2 | 11/2011 | Humayun et al. |
| 8,058,170 B2 | 11/2011 | Chandrashekar et al. |
| 8,062,977 B1 | 11/2011 | Ashtiani et al. |
| 8,087,966 B2 | 1/2012 | Hebbinghaus et al. |
| 8,101,521 B1 | 1/2012 | Gao et al. |
| 8,110,877 B2 | 2/2012 | Mukherjee et al. |
| 8,207,062 B2 | 6/2012 | Gao et al. |
| 8,258,057 B2 | 9/2012 | Kuhn et al. |
| 8,329,576 B2 | 12/2012 | Chan et al. |
| 8,367,546 B2 | 2/2013 | Humayun et al. |
| 8,409,985 B2 | 4/2013 | Chan et al. |
| 8,409,987 B2 | 4/2013 | Chandrashekar et al. |
| 8,551,885 B2 | 10/2013 | Chen et al. |
| 8,623,733 B2 | 1/2014 | Chen et al. |
| 8,709,948 B2 | 4/2014 | Danek et al. |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwak et al. |
| 2002/0090796 A1 | 7/2002 | Desai et al. |
| 2002/0117399 A1 | 8/2002 | Chen et al. |
| 2002/0132472 A1 | 9/2002 | Park |
| 2002/0155722 A1 | 10/2002 | Satta et al. |
| 2002/0168840 A1 | 11/2002 | Hong et al. |

(56) References Cited

U.S. PATENT DOCUMENTS

| | | |
|---|---|---|
| 2002/0177316 A1 | 11/2002 | Miller et al. |
| 2003/0059980 A1 | 3/2003 | Chen et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0129828 A1 | 7/2003 | Cohen |
| 2003/0190802 A1 | 10/2003 | Wang |
| 2004/0014315 A1 | 1/2004 | Lai et al. |
| 2004/0044127 A1 | 3/2004 | Okubo et al. |
| 2004/0142557 A1 | 7/2004 | Levy et al. |
| 2004/0202786 A1 | 10/2004 | Wongsenakhum et al. |
| 2004/0206267 A1 | 10/2004 | Sambasivan et al. |
| 2005/0031786 A1 | 2/2005 | Lee et al. |
| 2005/0059236 A1 | 3/2005 | Nishida et al. |
| 2005/0136594 A1 | 6/2005 | Kim |
| 2005/0179141 A1 | 8/2005 | Yun et al. |
| 2005/0191803 A1 | 9/2005 | Matsuse et al. |
| 2006/0003581 A1 | 1/2006 | Johnston et al. |
| 2006/0075966 A1 | 4/2006 | Chen et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0284317 A1 | 12/2006 | Ito et al. |
| 2007/0099420 A1 | 5/2007 | Dominguez et al. |
| 2007/0190780 A1 | 8/2007 | Chung et al. |
| 2008/0045010 A1 | 2/2008 | Wongsenakhum et al. |
| 2008/0081127 A1 | 4/2008 | Thompson et al. |
| 2008/0081453 A1 | 4/2008 | Kim et al. |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0280438 A1 | 11/2008 | Lai et al. |
| 2009/0053893 A1 | 2/2009 | Khandelwal et al. |
| 2009/0057151 A1 | 3/2009 | Shalyt et al. |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0035427 A1 | 2/2010 | Chan et al. |
| 2010/0055904 A1 | 3/2010 | Chen et al. |
| 2010/0130003 A1 | 5/2010 | Lin et al. |
| 2010/0155846 A1 | 6/2010 | Mukherjee et al. |
| 2010/0159694 A1 | 6/2010 | Chandrashekar et al. |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2011/0059608 A1 | 3/2011 | Gao et al. |
| 2011/0156154 A1 | 6/2011 | Hoentschel et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0199887 A1 | 8/2012 | Chan et al. |
| 2012/0231626 A1 | 9/2012 | Lee et al. |
| 2012/0244699 A1 | 9/2012 | Khandelwal et al. |
| 2013/0109172 A1 | 5/2013 | Collins et al. |
| 2013/0168864 A1 | 7/2013 | Lee et al. |
| 2013/0171822 A1 | 7/2013 | Chandrashekar et al. |
| 2013/0302980 A1 | 11/2013 | Chandrashekar et al. |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0073135 A1 | 3/2014 | Guan et al. |
| 2014/0154883 A1 | 6/2014 | Humayun et al. |
| 2014/0162451 A1 | 6/2014 | Chen et al. |

FOREIGN PATENT DOCUMENTS

| | | |
|---|---|---|
| EP | 1 179 838 | 2/2002 |
| JP | 08-115984 | 5/1996 |
| JP | 09-027596 | 1/1997 |
| JP | H10-144688 | 5/1998 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-124488 | 4/2002 |
| JP | 2004-235456 | 8/2004 |
| JP | 2004-273764 | 9/2004 |
| JP | 2005-518088 | 6/2005 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-250907 | 9/2007 |
| JP | 2007-251164 | 9/2007 |
| JP | 2008-091844 | 4/2008 |
| JP | 2008-283220 | 11/2008 |
| JP | 2009-024252 | 2/2009 |
| JP | 2009-144242 | 7/2009 |
| JP | 2009-540123 | 11/2009 |
| KR | 10-2005-0022261 | 3/2005 |
| KR | 10-2005-0087428 | 8/2005 |
| KR | 10-2006-0074593 | 7/2006 |
| KR | 20060087844 | 8/2006 |
| KR | 10-2007-0012525 | 1/2007 |
| KR | 705936 | 4/2007 |
| KR | 20080110897 | 12/2008 |
| KR | 10-2009-0103815 | 10/2009 |
| WO | WO 98/51838 | 11/1998 |
| WO | WO01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2007/121249 | 10/2007 |
| WO | WO 2007/146537 | 12/2007 |
| WO | WO2010/025357 | 3/2010 |
| WO | WO 2013/090295 | 6/2013 |
| WO | WO/2013/148444 | 10/2013 |
| WO | WO 2013/148880 | 10/2013 |

OTHER PUBLICATIONS

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

Wongsenakhum et al., "Method of Forming Low-Resistivity Tungsten Interconnects," Novellus Systems, Inc., U.S. Appl. No. 10/815,560, filed Mar. 31, 2004.

U.S. Office Action mailed Jul. 12, 2005, from U.S. Appl. No. 10/815,560.

(56) References Cited

OTHER PUBLICATIONS

Lee et al., "Method for Producing Ultra Thin Tungsten Layer With Improved Step Coverage," Novellus Systems, Inc., U.S. Appl. No. 09/975,074, filed Oct. 9, 2001.
U.S. Office Action mailed Jul. 17, 2002, from U.S. Appl. No. 09/975,074.
Lee et al., "Method for Producing Ultra Thin Tungsten Layer With Improved Step Coverage," Novellus Systems, Inc., U.S. Appl. No. 10/649,351, filed Aug. 26, 2003.
U.S. Office Action mailed Feb. 8, 2005, from U.S. Appl. No. 10/649,351.
U.S. Final Office Action mailed Jul. 14, 2005, from U.S. Appl. No. 10/649,351.
Presentation by Inventor James Fair: "Chemical Vapor Deposition of Refractory Metal Silicides," 27 Pages, 1983.
Saito et al., "A Novel Copper Interconnection Technology Using Self Aligned Metal Capping Method," IEEE, 3 Pages, 2001.
Fair et al., "Selective Refractory Metal and Nitride Capping," Novellus Systems, Inc., U.S. Appl. No. 10/435,010, filed May 9, 2003.
U.S. Office Action mailed Jun. 22, 2004, from U.S. Appl. No. 10/435,010.
Levy et al., "Deposition of Tungsten Nitride," Novellus Systems, Inc., U.S. Appl. No. 10/690,492, filed Oct. 20, 2003.
U.S. Office Action mailed Mar. 23, 2005, from U.S. Appl. No. 10/690,492.
Fair et al., "Selective Refractory Metal and Nitride Capping," Novellus Systems, Inc., U.S. Appl. No. 10/984,126, filed Nov. 8, 2004.
U.S. Office Action mailed Nov. 23, 2005, from U.S. Appl. No. 10/984,126.
Levy et al., "Deposition of Tungsten Nitride", Novellus Systems, Inc., filed Dec. 16, 2005, U.S. Appl. No. 11/305,368, pp. 1-39.
U.S. Final Office Action mailed Dec. 28, 2005, from U.S. Appl. No. 10/815,560.
U.S. Office Action mailed Dec. 30, 2005, from U.S. Appl. No. 10/649,351.
Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.
U.S. Office Action mailed Apr. 17, 2006, from U.S. Appl. No. 10/815,560.
U.S. Final Office Action mailed May 17, 2006, from U.S. Appl. No. 10/984,126.
U.S. Office Action mailed Sep. 28, 2006, from U.S. Appl. No. 10/815,560.
Gao et al., "Methods for Improving Uniformity and Resistivity of Thin Tungsten Films," Novellus Systems, Inc, filed Jul. 24, 2007, U.S. Appl. No. 11/782,570, pp. 1-23.
Chan et al., "Methods for Growing Low-Resistivity Tungsten for High Aspect Ratio and Small Features," Novellus Systems, Inc., U.S. Appl. No. 12/030,645, filed Feb. 13, 2008.
Humayun et al., "Methods for Forming All Tungsten Contacts and Lines," Novellus Systems, Inc., U.S. Appl. No. 11/963,698, filed Dec. 21, 2007.
Chan et al., "Method for Improving Uniformity and Adhesion of Low Resistivity Tungsten Film," Novellus Systems, Inc., U.S. Appl. No. 11/951,236, filed Dec. 5, 2007.
Notice of Allowance and Fee Due mailed Mar. 12, 2003, from U.S. Appl. No. 09/975,074.
Notice of Allowance and Fee Due mailed Jul. 21, 2006, from U.S. Appl. No. 10/649,351.
Notice of Allowance and Fee Due mailed Oct. 7, 2004, from U.S. Appl. No. 10/435,010.
Notice of Allowance and Fee Due mailed Aug. 25, 2006, from U.S. Appl. No. 10/984,126.
Notice of Allowance and Fee Due mailed Sep. 14, 2005, from U.S. Appl. No. 10/690,492.
Notice of Allowance and Fee Due mailed Apr. 24, 2007, from U.S. Appl. No. 10/815,560.
U.S. Office Action mailed Jun. 27, 2008, from U.S. Appl. No. 11/305,368.
Chan et al., "Methods for Growing Low-Resistivity Tungsten Film," Novellus Systems, Inc., U.S. Appl. No. 11/265,531, filed Nov. 1, 2005.
U.S. Office Action mailed Aug. 21, 2008, from U.S. Appl. No. 11/265,531.
Ashtiani et al., "Ternary Tungsten-Containing Thin Film Heater Elements," Novellus Systems, Inc., U.S. Appl. No. 61/025,237, filed Jan. 31, 2008.
Chen et al., "Method for Reducing Tungsten Roughness and Improving Reflectivity," Novellus Systems, Inc., U.S. Appl. No. 12/202,126, filed Aug. 29, 2008.
U.S. Office Action mailed Oct. 16, 2008, from U.S. Appl. No. 11/349,035.
U.S. Office Action mailed Sep. 29, 2008, from U.S. Appl. No. 11/782,570.
Ashtiani et al., "Ternary Tungsten-Containing Thin Films," Novellus Systems, Inc., U.S. Appl. No. 12/363,330, filed Jan. 30, 2009.
Chandrashekar et al., "Method for depositing thin tungsten film with low resistivity and robust micro-adhesion characteristics," Novellus Systems, Inc., U.S. Appl. No. 61/061,078, filed Jun. 12, 2008.
U.S. Final Office Action mailed Apr. 28, 2009, from U.S. Appl. No. 11/782,570.
U.S. Office Action mailed Apr. 3, 2009, from U.S. Appl. No. 11/305,368.
U.S. Final Office Action mailed Feb. 26, 2009, from U.S. Appl. No. 11/265,531.
U.S. Notice of Allowance mailed May 4, 2009 from U.S. Appl. No. 11/265,531.
U.S. Final Office Action mail Feb. 25, 2009, from U.S. Appl. No. 11/349,035.
U.S. Office Action mailed Jun. 11, 2009, from U.S. Appl. No. 11/963,698.
U.S. Office Action mailed Jun. 4, 2009, from U.S. Appl. No. 11/349,035.
Ken K. Lai and H. Henry Lamb, Precursors for Organometallic Chemical Vapor Deposition of Tungsten Carbide Films, 1995, Chemistry Material, pp. 2284-2292.
U.S. Office Action mailed Jun. 24, 2009 from U.S. Appl. No. 12/030,645.
U.S. Office Action mailed Aug. 5, 2009, from U.S. Appl. No. 11/951,236.
Ashtiani et al., "Ternary Tungsten-Containing Resistive Thin Films," Novellus Systems, Inc., U.S. Appl. No. 12/363,330, filed Jan. 30, 2009.
Chandrashekar et al., "Method for Depositing Thin Tungsten Film With Low Resistivity and Robust Micro-Adhesion Characteristics," Novellus Systems, Inc., U.S. Appl. No. 12/407,541, filed Mar. 19, 2009.
U.S. Office Action mailed Oct. 21, 2009 from U.S. Appl. No. 12/202,126.
U.S. Notice of Allowance mailed Nov. 17, 2009 from U.S. Appl. No. 11/305,368.
U.S. Final Office Action mailed Nov. 20, 2009 from U.S. Appl. No. 11/349,035.
U.S. Final Office Action mailed Dec. 9, 2009 from U.S. Appl. No. 11/963,698.
U.S. Notice of Allowance mailed Sep. 17, 2009 from U.S. Appl. No. 11/782,570.
Chan et al., "Methods for Growing Low-Resistivity Tungsten Filml", Novellus Systems Inc., U.S. Appl. No. 12/538,770, filed Aug. 10, 2009.
U.S. Final Office Action mailed Jan. 13, 2010 from U.S. Appl. No. 12/030,645.
Gao et al., "Method for Improving Adhesion of Low Resistivity Tungsten/Tungsten Nitride Layers," Novellus Systems, Inc., U.S. Appl. No. 12/556,490, filed Sep. 9, 2009.
Gao et al., "Methods for Improving Uniformity and Resistivity of Thin Tungsten Films," Novellus Systems, Inc, filed Dec. 11, 2009, U.S. Appl. No. 12/636,616.
U.S. Office Action mailed Jan. 26, 2010 from U.S. Appl. No. 11/951,236.
U.S. Notice of Allowance mailed Mar. 2, 2010 from U.S. Appl. No. 11/349,035.

(56) References Cited

OTHER PUBLICATIONS

Danek, et al, "Tungsten Barrier and Seed for Copper Filled TSV," Novellus Systems, Inc., filed Mar. 12, 2010, U.S. Appl. No. 12/723,532.
Chandrashekar, et al., "Method for Forming Tungsten Contacts and Interconnects with Small Critical Dimensions," Novellus Systems, Inc, filed Apr. 6, 2010, U.S. Appl. No. 12/755,248.
Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.
U.S. Notice of Allowance mailed Apr. 6, 2010 from U.S. Appl. No. 11/951,236.
U.S. Office Action mailed May 3, 2010 from U.S. Appl. No. 12/407,541.
U.S. Final Office Action mailed May 7, 2010 from U.S. Appl. No. 12/202,126.
Chan et al., "Method for Improving Uniformity and Adhesion of Low Resistivity Tungsten Film," Novellus Systems, Inc., U.S. Appl. No. 12/829,119, filed Jul. 1, 2010.
U.S. Office Action mailed Jun. 11, 2010 from U.S. Appl. No. 11/963,698.
U.S. Final Office Action mailed Jul. 23, 2010 from U.S. Appl. No. 12/030,645.
U.S. Office Action mailed Jul. 26, 2010 from U.S. Appl. No. 12/202,126.
International Search Report and Written Opinion mailed Apr. 12, 2010 from Application No. PCT/US2009/055349.
Hoover, Cynthia, "Enabling Materials for Contact Metallization," Praxair Electronic Materials R&D, Jul. 2007, pp. 1-16.
Purchase of ethylcyclopentadienyl)dicarbonylnitrosyltungsten from Praxair in Oct. 2006.
U.S. Final Office Action mailed Oct. 19, 2010 from U.S. Appl. No. 12/407,541.
U.S. Office Action for U.S. Appl. No. 12/538,770 mailed Nov. 23, 2010.
U.S. Final Office Action for U.S. Appl. No. 11/963,698 mailed Dec. 30, 2010.
U.S. Office Action for U.S. Appl. No. 12/636,616 mailed Jan. 25, 2011.
U.S. Final Office Action mailed Feb. 7, 2011 from U.S. Appl. No. 12/202,126.
Notice of Allowance and Fee Due mailed Jan. 24, 2011, from U.S. Appl. No. 12/030,645.
Chan et al., "Methods for Growing Low-Resistivity Tungsten for High Aspect Ratio and Small Features," Novellus Systems, Inc., U.S. Appl. No. 13/095,734, filed Apr. 27, 2011.
U.S. Office Action for U.S. Appl. No. 12/407,541 mailed May 2, 2011.
U.S. Office Action for U.S. Appl. No. 12/755,248 mailed May 13, 2011.
U.S. Office Action for U.S. Appl. No. 12/556,490 mailed Jun. 14, 2011.
U.S. Final Office Action for U.S. Appl. No. 12/636,616 mailed Jun. 15, 2011.
Notice of Allowance for U.S. Appl. No. 12/538,770 mailed Jun. 30, 2011.
U.S. Office Action for U.S. Appl. No. 12/829,119 mailed Jun. 30, 2011.
Notice of Allowance mailed Jul. 25, 2011, for U.S. Appl. No. 12/363,330.
Korean First Notification of Provisional Rejection mailed Dec. 8, 2010, dated Application No. 2004-0036346.
Notice of Allowance mailed Sep. 2, 2011, for U.S. Appl. No. 11/963,698.
Notice of Allowance mailed Sep. 19, 2011, for U.S. Appl. No. 12/407,541.

Chan et al., "Methods of Controlling Tungsten Film Properties," Novellus Systems, Inc., U.S. Appl. No. 13/020,748, filed Feb. 3, 2011.
Chandrashekar et al., "Method for Depositing Thin Tungsten Film With Low Resistivity and Robust Micro-Adhesion Characteristics," Novellus Systems, Inc., U.S. Appl. No. 13/244,016, filed Sep. 23, 2011.
U.S. Office Action for U.S. Appl. No. 12/755,248 mailed Oct. 28, 2011.
Notice of Allowance for U.S. Appl. No. 12/636,616 mailed Sep. 30, 2011.
Humayun et al., "Methods for Forming All Tungsten Contacts and Lines," Novellus Systems, Inc., U.S. Appl. No. 13/276,170, filed Oct. 18, 2011.
U.S. Final Office Action for U.S. Appl. No. 12/829,119, mailed Nov. 17, 2011.
U.S. Appl. No. 12/755,259, Office Action mailed Feb. 16, 2012.
Notice of Allowance for U.S. Appl. No. 12/556,490 mailed Mar. 2, 2012.
U.S. Office Action, dated May 10, 2012, issued in U.S. Appl. No. 13/020,748.
U.S. Office Action for U.S. Appl. No. 13/244,016, mailed Mar. 6, 2012.
U.S. Office Action for U.S. Appl. No. 12/829,119, mailed Apr. 19, 2012.
U.S. Office Action for U.S. Appl. No. 13/276,170, mailed Apr. 16, 2012.
U.S. Final Office Action for U.S. Appl. No. 12/755,248 mailed Apr. 30, 2012.
Notification of Provisional Rejection mailed Jul. 17, 2012, for Application No. 2010-0087997.
Office Action for U.S. Appl. No. 13/095,734, mailed Aug. 6, 2012.
Notice of Allowance for U.S. Appl. No. 12/829,119, mailed Aug. 7, 2012.
Notification of Provisional Rejection mailed Sep. 6, 2012, for Application No. 2011-7004322.
U.S. Final Office Action dated Sep. 12, 2012 issued in U.S. Appl. No. 12/755,259.
U.S Appl. No. 14/135,375, filed Dec. 19, 2013, entitled "Method for Depositing Extremely Low Resistivity Tungsten,".
U.S. Appl. No. 14/097,160, filed Dec. 4, 2013, entitled "Methods for Depositing Ultra Thin Low Resistivity Tungsten Film for Small Critical Dimension Contacts and Interconnects."
US Office Action, dated Jun. 11, 2010, issued in U.S. Appl. No. 11/963,698.
US Office Action, dated Oct. 28, 2011, issued in U.S. Appl. No. 12/755,248.
US Office Action, dated Feb. 16, 2012, issued in U.S. Appl. No. 12/755,259.
US Notice of Allowance, dated Jul. 10, 2013, issued in U.S. Appl. No. 12/755,259.
US Notice of Allowance dated Sep. 4, 2013 issued in U.S. Appl. No. 12/755,259.
US Office Action, dated Feb. 24, 2014, issued in U.S. Appl. No. 13/020,748.
US Office Action, dated Jun. 20, 2013, issued in U.S. Appl. No. 13/560,688.
US Final Office Action, dated Feb. 14, 2014, issued in U.S. Appl. No. 13/560,688.
US Final Office Action, dated Nov. 26, 2013, issued in U.S. Appl. No. 13/633,798.
Japanese Office Action dated Sep. 3, 2013, issued in Application No. JP 2008-325333.
PCT International Preliminary Report on Patentability and Written Opinion, dated Mar. 10, 2011, issued in PCT/US2009/055349.
Japanese Office Action dated Dec. 3, 2013 issued in Application No. 2011-525228.
Korean Office Action dated Jul. 19, 2013 issued in Application No. 2011-7004322.
Korean Office Action dated Nov. 4, 2013 issued in Application No. 10-2013-7027117.
Korean Second Office Action dated Jan. 25, 2014 in KR Application No. 10-2010-0035453.

(56) References Cited

OTHER PUBLICATIONS

Becker, Jill (Apr. 7, 2003) "Diffusion barrier properties of tungsten nitride films grown by atomic layer deposition from bis(tert-butylimido)bis(dimethylamido)tungsten and ammonia," Applied Physics Letters, 82(14):2239-2241, [Retrieved online Dec. 13, 2013 at http://dx.doi.org/10.1063/1.1565699].
Diawara, Y. et al. (1993) "Rapid thermal annealing for reducing stress in tungsten x-ray mask absorber," http://dx.doi.org/10.1116/1.586673, Journal of Vacuum Science & Technology B 11:296-300 (per table of contents of journal).
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf.], Materials Transactions, 43(7):1585-1592.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], Thin Solid Films, 370:114-121.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], Journal of Applied Physics, 58(11):4194-4199.
U.S. Appl. No. 13/862,048, filed Apr. 12, 2013, entitled "CVD Based Metal/Semiconductor Ohmic Contact for High Volume Manufacturing Applications,".
U.S. Appl. No. 13/758,928, filed Feb. 4, 2013, entitled "Methods for Forming All Tungsten Contacts and Lines."
U.S. Appl. No. 13/851,885, filed Mar. 27, 2013, entitled "Tungsten Feature Fill."
U.S. Appl. No. 13/560,688, filed Jul. 27, 2012, entitled "Methods of improving Tungsten Contact Resistance in Small Critical Dimension Features."
U.S. Appl. No. 13/633,798, filed Oct. 2, 2012, entitled "Method for Depositing Tungsten Film With Low Roughness and Low Resistivity,".
U.S. Appl. No. 13/928,216, filed Jun. 26, 2013, entitled "Methods of Forming Tensile Tungsten Films and Compressive Tungsten Films."
US Notice of Allowance, dated Jan. 19, 2005, issued in U.S. Appl. No. 10/435,010.
Notice of Allowance dated Dec. 3, 2012, issued in U.S. Appl. No. 13/095,734.
US Notice of Allowance, dated Oct. 4, 2012, issued in U.S. Appl. No. 13/276,170.
US Office Action, dated Jan. 7, 2013, issued in U.S. Appl. No. 12/202,126.
US Notice of Allowance, dated Jun. 7, 2013, issued in U.S. Appl. No. 12/202,126.
US Notice of Allowance dated Nov. 29, 2012, issued in U.S. Appl. No. 13/244,016.
US Office Action, dated Feb. 15, 2013, issued in U.S. Appl. No. 12/755,248.
US Office Action dated Dec. 18, 2012, issued in U.S. Appl. No. 12/723,532.
US Office Action dated Jul. 18, 2012, issued in U.S. Appl. No. 12/723,532.
US Final Office Action, dated Nov. 16, 2012, issued in U.S. Appl. No. 13/020,748.
US Office Action, dated Jun. 20, 2013, issued in U.S. Appl. No. 13/650,688.
US Office Action, dated Jun. 14, 2013, issued in U.S. Appl. No. 13/633,798.
Korean Office Action, dated Jun. 13, 2011, issued in Application No. 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Chinese Office Action dated Sep. 18, 2012 issued in application No. 200980133560.1.
Chinese Office Action dated Aug. 7, 2013 issued in application No. 200980133560.1.
Korean Office Action dated Mar. 21, 2013 issued in KR Application No. 10-2010-0024905.
Korean Office Action dated Mar. 4, 2013 in KR Application No. 2010-0035449.
PCT International Search Report and Written Opinion, dated Mar. 28, 2013, issued in PCT/US2012/069016.
Korean Office Action dated Mar. 4, 2013 in KR Application No. 2010-0035453.
PCT International Search Report and Written Opinion, dated Jun. 28, 2013, issued in PCT/US2013/033174.
PCT International Search Report and Written Opinion, dated Jul. 26, 2013, issued in PCT/US2013/034167.
US Office Action, dated May 30, 2014, issued in U.S. Appl. No. 13/862,048.
US Final Office Action, dated Jul. 2, 2014, issued in U.S. Appl. No. 13/020,748.
US Notice of Allowance, dated May 23, 2014, issued in U.S. Appl. No. 13/633,798.
Chinese Third Office Action dated Apr. 22, 2014 issued in Application No. 200980133560.1.
Japanese Office Action dated Jun. 17, 2014 issued in Application No. JP 2010-055163.
Korean Office Action dated Jun. 17, 2014 issued in Application No. 10-2013-7027117.
Japanese Office Action dated Mar. 4, 2014 issued in JP 2010-093522.
Japanese Office Action dated Jul. 29, 2014 issued in JP 2010-093544.
Manik, P., et al. (2012) "Fermi-level unpinning and low resistivity in contacts to n-type Ge with a thin ZnO interfacial layer," App. Phys. Lett. 101:182105-5.

METHOD FOR PRODUCING ULTRA-THIN TUNGSTEN LAYERS WITH IMPROVED STEP COVERAGE

CROSS-REFERENCE TO RELATED PATENT APPLICATIONS

This application is a continuation-in-part of U.S. patent application Ser. No. 13/095,734, filed Apr. 27, 2011, which is a continuation of U.S. patent application Ser. No. 12/030,645, (now U.S. Pat. No. 7,955,972), filed Feb. 13, 2008, which claims priority from U.S. Provisional Patent Application No. 60/904,015, filed Feb. 27, 2007 and which is also a continuation-in-part of U.S. patent application Ser. No. 11/265,531, (now U.S. Pat. No. 7,589,017), filed Nov. 1, 2005, which in turn is a continuation-in-part of U.S. patent application Ser. No. 10/815,560 (now U.S. Pat. No. 7,262,125), filed Mar. 31, 2004, which in turn is a continuation-in-part of U.S. patent application Ser. No. 10/649,351 (now U.S. Pat. No. 7,141,494), filed on Aug. 26, 2003, which is in turn a continuation-in-part of U.S. patent application Ser. No. 09/975,074 (now U.S. Pat. No. 6,635,965) filed Oct. 9, 2001, which in turn claims priority from U.S. Provisional Patent Application No. 60/292,917, filed May 22, 2001. All prior applications are incorporated herein by reference for all purposes.

FIELD OF THE INVENTION

The present invention relates to the chemical vapor deposition of a tungsten film, and more particularly, to the nucleation of that deposition process on a semiconductor substrate.

BACKGROUND OF THE INVENTION

In Integrated Circuit (IC) manufacturing individual devices, such as the transistors, are fabricated in the silicon substrate and then they are connected together to perform the desired circuit functions. This connection process is generally called "metallization", and is performed using a number of photolithographic patterning, etching, and deposition steps.

The deposition of tungsten (W) films using chemical vapor deposition (CVD) techniques is an integral part of many semiconductor fabrication processes since it can produce low resistivity electrical connection between i) adjacent metal layers (vias) and ii) first metal layer and the devices on the silicon substrate (contact). Typically the W film is deposited through the reduction of tungsten hexafluoride ($WF_6$) by hydrogen ($H_2$) or silane ($SiH_4$). In a typical tungsten process, the wafer is heated to the process temperature in a vacuum chamber, and them soaked in $SiH_4$ gas to protect the already deposited titanium liner thin film on the substrate from possible reaction with $WF_6$. A thin layer of tungsten film, known as the seed or nucleation layer, is deposited by the reaction of $WF_6$ and $SiH_4$. Finally, the via or contact is filled with tungsten by the reaction of $WF_6$ and $H_2$ ("plugfill").

Conventionally, the $WF_6$ and reducing gas ($SiH_4$ or $H_2$) are simultaneously introduced into the reaction chamber. It is expected that in a tungsten process all vias and contacts are completely filled with tungsten material, i.e., a 100% plugfill is achieved. The tungsten plugfill process is very sensitive to the conformality of the tungsten seed or nucleation layer in the vias and contacts.

The common problems associated with many seed layer deposition techniques are poor sidewall step coverage and conformality. This means that the seed layer is much thicker in wide-open areas, such as on top of the contacts and vias as compared to the bottom and lower portion of the sidewalls of the contacts and vias. With the decrease of the design rule of semiconductor devices, the diameter of the contacts and vias get smaller while their heights do not decrease. Thus, the aspect ratio (height divided by diameter) of contacts and vias keep increasing. The increased aspect ratio exacerbates the problem with the step coverage and conformality, thus degrading the quality of the plugfill process.

In a conventional CVD process, reactive gases arrive at the substrate simultaneously with film growth resulting from continuous chemical reaction of the precursor and reactant gases on the substrate surface. Uniform and reproducible growth of the film is dependent on maintenance of the correct precursor and reactant flux at the substrate. The growth rate is proportional to the precursor flux at the substrate and to the substrate temperature.

Atomic layer deposition (ALD) is a method of sequentially depositing a plurality of atomic layers on a semiconductor substrate by sequentially injecting and removing reactants into and from a chamber. ALD is a surface controlled process and uses two-dimensional layer by layer deposition. ALD uses a chemical reaction like CVD but it is different from CVD in that reactant gases are individually injected in the form of a pulse instead of simultaneously injecting reactant gases, so they are not mixed in the chamber. For example, in a case of using gases A and B, gas A is first injected into a chamber and the molecules of gas A are chemically or physically adsorbed to the surface of a substrate, thereby forming an atomic layer of A. The gas A remaining in the chamber is purged using an inert gas such as argon gas or nitrogen gas. Thereafter, the gas B is injected and chemically or physically adsorbed, thereby forming an atomic layer of B on the atomic layer of A. Reaction between the atomic layer of A and the atomic layer of B occurs on the surface of the atomic layer of A only. For this reason, a superior step coverage can be obtained regardless of the morphology of the substrate surface. After the reaction between A and B is completed, residuals of gas B and by products of the reaction are purged from the chamber. The process is repeated for multiple layers of material to be deposited.

Thus, in contrast to the CVD process, ALD is performed in a cyclic fashion with sequential alternating pulses of the precursor, reactant and purge gases. The ALD precursor must have a self-limiting effect such that the precursor is adsorbed on the substrate in a monolayer atomic thickness. Because of the self-limiting effect, only one monolayer or a sub-monolayer is deposited per operation cycle. ALD is conventionally conducted at pressures less than 1 Torr.

Methods, which would form uniform seed layers in channel or vias and result in an improvement in the subsequent filling of the channel or vias by conductive materials, has long been sought, but has eluded those skilled in the art.

SUMMARY OF THE INVENTION

The present invention provides a method of forming a tungsten nucleation layer a surface of a semiconductor substrate. The method comprises the steps of comprising the steps of: positioning said semiconductor substrate at a deposition station within a single or multi-station deposition chamber; heating said semiconductor substrate to a temperature between approximately 250 to 475° C. at said deposition station; and performing an initiation soak step, which consists of exposure of the substrate to a gas in a gaseous or plasma state for about 2 to about 60 seconds. A reducing gas is subsequently flowed into the deposition chamber whereby about one or more, preferably two or more, and most preferably, three or more monolayers of reducing gas are deposited onto the surface of the substrate. The deposition chamber is then purged of the reducing gas and a tungsten-containing gas is flowed into the chamber, whereby the deposited reducing gas is substantially replaced by tungsten to provide the nucleation layer.

Preferably, the initiation soak gas comprises $SiH_4$, $B_2H_6$, $Si_2H_6$, $H_2$, Ar, $N_2$, or $O_2$, or a combination thereof and the soak gas is provided in a gaseous or plasma state. The plasma state can be produced using a radiofrequency or microwave energy source.

In a preferred embodiment, the reducing gas comprises $SiH_4$, $Si_2H_6$, $H_2$. $B_2H_6$, or $SiH_2Cl_2$ or a combination thereof. The reducing gas may further comprise, argon, hydrogen, nitrogen, or a combination thereof.

Preferably, the tungsten-containing gas comprises $WF_6$, $WCl_6$, or $W(CO)_6$ or a mixture thereof. The tungsten-containing gas may further comprise argon, hydrogen, nitrogen or a mixture thereof.

According to some embodiments, the method further comprises the step of purging the tungsten-containing gas from the chamber. Purging can be accomplished through the introduction of a purge gas, such as hydrogen, nitrogen, an inert gas, or a mixture thereof. Alternatively, the gases may be evacuated from the chamber using a vacuum pump.

The method of the invention can be repeated until the desired thickness of tungsten nucleation layer is obtained and/or may comprise further steps to produce a desired IC.

BRIEF DESCRIPTION OF THE DRAWINGS

The present invention may be better understood, and its numerous objects, features, and advantages made apparent to those skilled in the art by referencing the accompanying drawings. For ease of understanding and simplicity, common numbering of elements within the illustrations is employed where the element is the same between illustrations.

Panel A of FIG. 1 illustrates the relationship between nucleation layer film thickness and number of cycles at temperatures ranging from 150 to 450° C. with dosing of 40 sccm of $SiH_4$ for 2 seconds and 600 sccm of $WF_6$ for 2 seconds. Panel B of FIG. 1 shows the relationship between growth rate and number of cycles under similar process parameters.

DETAILED DESCRIPTION OF THE INVENTION

Figure 1:
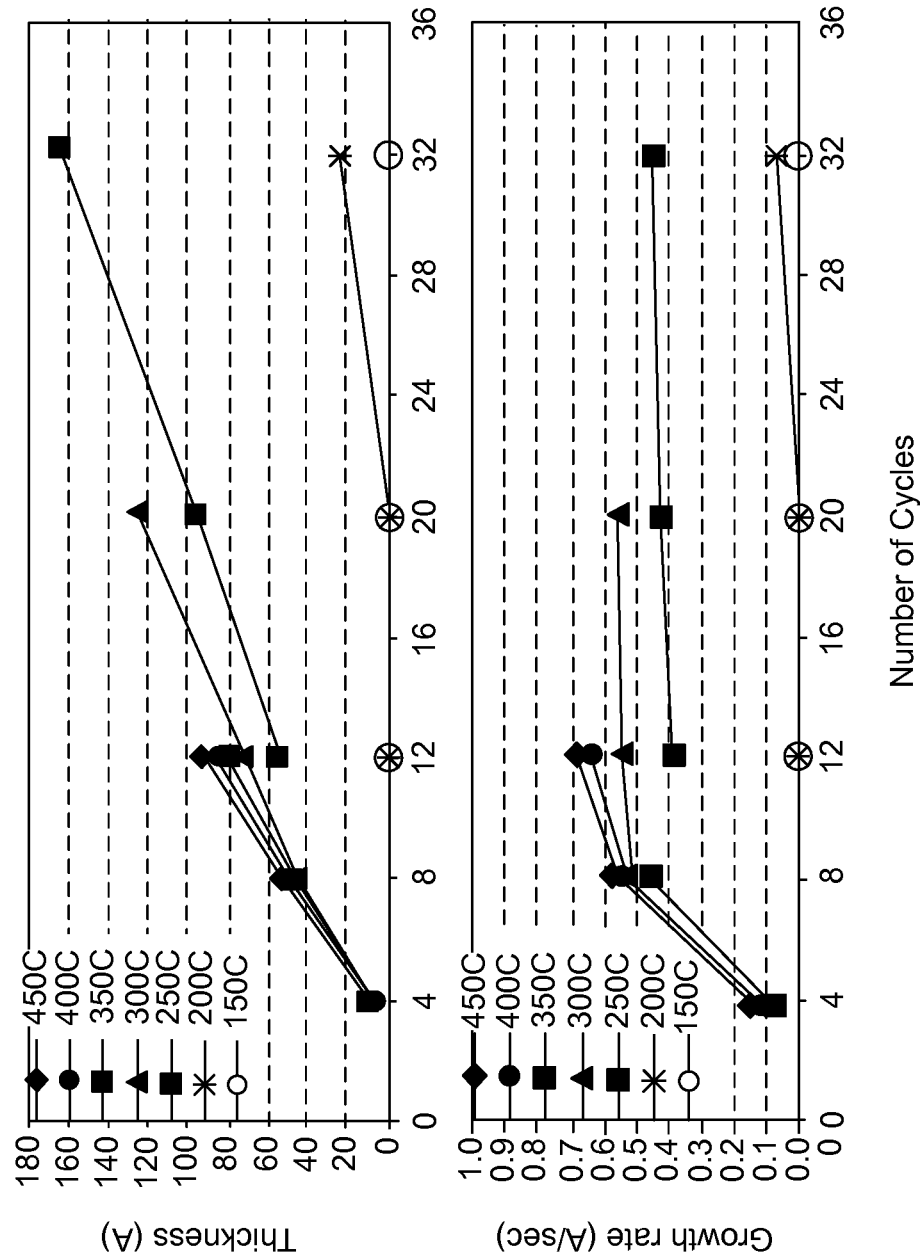

Embodiments of the present invention will be described with reference to the aforementioned figures. These figures are simplified for ease of understanding and description of embodiments of the present invention only. Modifications, adaptations or variations of specific methods and or structures shown and discussed herein may become apparent to those skilled in the art. All such modifications, adaptations or variations that rely upon the teachings of the present invention, and through which these teachings have advanced the art, are considered to be within the spirit and scope of the present invention.

Overview

The present invention provides a method to form a conformal tungsten nucleation layer by depositing a plurality of tungsten layers, each of about one or more monolayers in thickness, on a semiconductor substrate by sequentially injecting and removing reactants into and from a chamber. According to one embodiment of the invention, the method comprises the steps of:

positioning the semiconductor substrate at a deposition station within a deposition chamber;

heating the semiconductor substrate to a temperature between approximately 250 and 475° C., and preferably at about 350° C., at the deposition station;

performing an initiation soak step, which comprises exposure of the substrate to a gas in a gaseous or plasma state for about 2-60 seconds to reduce or eliminate any nucleation delay;

flowing a reducing gas into said deposition chamber whereby about one or more monolayers of the reducing gas are deposited onto said surface of said substrate;

purging the reducing gas from the deposition chamber; and flowing a tungsten-containing gas into said deposition chamber, whereby said deposited reducing gas is substantially replaced by tungsten to provide said nucleation layer.

In a particularly preferred embodiment, the pressure of the deposition chamber is maintained at more than about 1 Torr. Preferably, two or more monolayers and more preferably, three or more monolayers, of the reducing gas are deposited onto the surface of the substrate. This cycle can be repeated as necessary to produce a smooth and uniform tungsten nucleation layer with the desired thickness The Method According to the methods of the invention, a first wafer or semiconductor substrate is placed into the deposition or reaction chamber and onto a station which has been heated to between approximately 250 and 475° C., and preferably between about 250 and 350° C. Prior to the pulsed nucleation process, the semiconductor substrate, optionally, has been exposed to a gas which promotes growth of tungsten with no delays. This step, which is called an initiation soak step, comprises exposure of the substrate to a gas such as $SiH_4$, $B_2H_6$, $Si_2H_6$, $H_2$, Ar, $N_2$, or $O_2$, or a combination thereof, in a gaseous or plasma state for about 2 to about 60 seconds. The plasma state can be produced using a radiofrequency or microwave energy source. This serves to precondition the substrate surface.

Any reducing agents such as $SiH_4$, $B_2H_6$, $Si_2H_6$, $SiH_2Cl_2$, or $H_2$, or a combination thereof, could be used for the pulsed nucleation process. Preferably, the reducing gas will comprise $SiH_4$ along with an inert carrier gas. The reducing gas is supplied at flow rates of approximately 400 to about 220, and more preferably, at about 100 to about 200, and most preferably about 200 standard cubic centimeters per second (sccm). This flow is continued for a predetermined time, typically about 5 seconds or less and preferably, about 2 seconds, and the flow of reducing gases is stopped. Generally, a gas line charge time of about 0.5 seconds is used to pressurize the gas flow lines leading to the deposition chamber prior to release of the gas into the chamber. Upon completion of the reducing gas flow time in the chamber, the gas line to the chamber is closed and then evacuated for about 0.5 seconds by utilization of a rough pump line. This is the gas line purge time. The line charge and purge times of the reducing gas can be overlapped with the chamber purge times The reaction chamber is purged prior to beginning the flow of the tungsten-containing gases. Purging preferably is accomplished by introduction of an inert gas, or nitrogen, or hydrogen, or a mixture thereof into the deposition chamber at fixed pressure and/or the vapor phase in the deposition chamber is removed through the application of a low pressure vacuum, preferably using a fast pump.

Any tungsten-containing gas, including but not limited to, $WF_6$, $WCl_6$, or $W(CO)_6$ can be used for the pulsed nucleation process. Preferably, the tungsten-containing gas comprises $WF_6$ along with an inert carrier gas. Typically, the tungsten-containing gas flow rate is between approximately 200 to about 900 sccm; preferably, between about 200 and 800 sccm, and most preferably, at about 600 sccm. It has been found that tungsten deposition occurs only on the surface where reducing gas has been absorbed. This flow is continued for a predetermined time, typically about 5 seconds or less and preferably, about 2 seconds, and the flow of reducing gases is stopped. Generally, a line charge of about 0.5 seconds is used. Upon completion of the tungsten-containing gas flow time in the chamber, the gas line to the chamber is closed and then evacuated for about 0.5 seconds by utilization of a rough pump line. This is the gas line purge time. The line charge and purge times of the tungsten-containing gas can be overlapped with the chamber purge times.

It will be understood that an inert gas such as argon or another gas such as nitrogen or hydrogen, or a combination thereof may be provided as the background gas to the deposition station simultaneously with the reducing gases or the tungsten-containing gases. In general, the flow of the background gases are continuous, i.e., it is not switched on and off as are the tungsten-containing gas and the reducing gas.

Using the methods described herein, the growth rate of tungsten per cycle is between about 8 and 12 Angstroms, and preferably between about 10 and 12 Angstroms per cycle as compared to a growth rate of less than 2.5 A that can be achieved using the conventional ALD processes.

The Product

The present invention provides a method for forming seed layers in contacts or vias with improved step coverage. More specifically, using the methods described herein, nucleation layers having a step coverage of greater than 75%; preferably, greater than 80%; and more preferably, greater than 90% can be achieved. In addition, this level of step coverage can be repeatedly and routinely produced in even high aspect ratio contacts, including, but not limited to contacts have an aspect ratio of greater than 10:1, or even 13:1 or greater.

Panel A of FIG. 1 illustrates the relationship between nucleation layer film thickness and number of cycles. Panel B of FIG. 1 shows the relationship between growth rate and number of cycles. The depositions were done at a substrate temperature of between 250 and 350° C. As shown, the nucleation layers will generally have a thickness of greater than about 50 Angstroms; and preferably, between about 80 and about 100 Angstroms.

Figure 2:
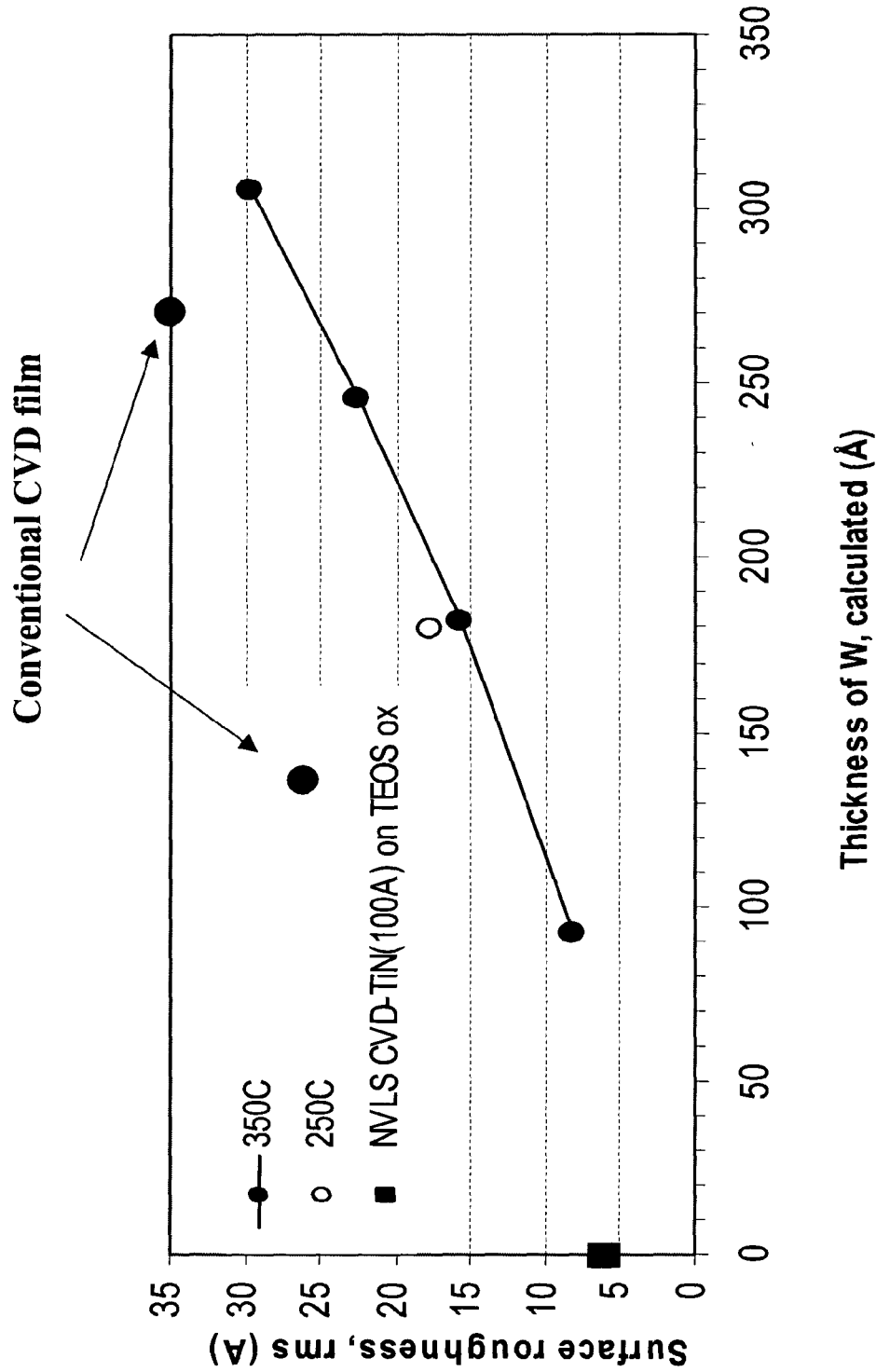
FIG. 2 shows the relationship of surface roughness, measured in Angstroms with thickness of the pulsed nucleation layer for nucleation layers produced by conventional CVD technology (large dark circles); pulsed nucleation technology at 350° C. (small dark circles); pulsed nucleation technology at 250° C. (hollow circles) and a semiconductor substrate comprising CVD-TiN (100 Angstroms) on TEOS oxide (squares).

As shown in FIG. 2, the pulsed nucleation layers produced by the methods described herein are substantially less rough and have a smaller grain size, as measure by atomic force microscopy, than tungsten films produced by conventional CVD.

Subsequent Process Steps

Figure 3:
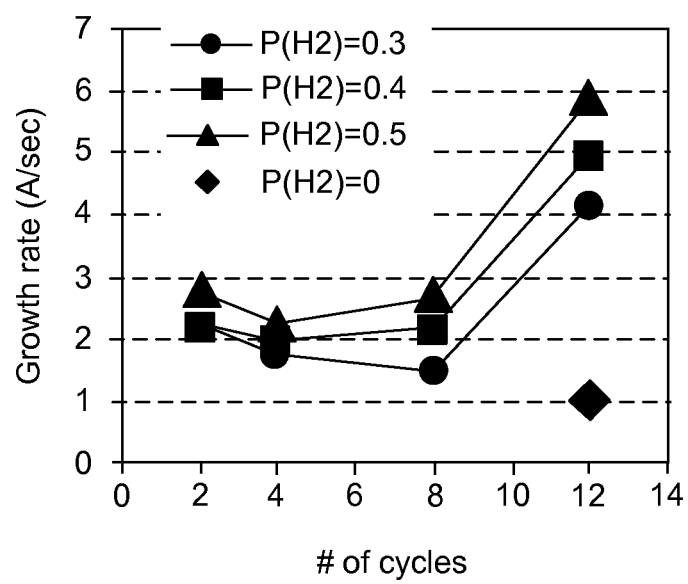
FIG. 3 depicts the relationship between growth or deposition rate (in Angstroms/second) and number of cycles for an embodiment of the invention wherein continuous hydrogen delivery, at various pressures, is used in connection with the pulsed nucleation.

According to aspect of the invention, the pulsed nucleation cycle described above can be repeated until a near-continuous, e.g., >50%, nucleation layer is formed. Subsequent cycles optionally are performed with continuous hydrogen gas flow in connection with the alternating pulses of reducing and tungsten-containing gases. Preferably, about four to ten cycles of the pulsed nucleation are performed prior to the use of hydrogen with the tungsten-containing gases. As shown in FIG. 3, the use of continuous hydrogen results in an increase in growth rate and thus, a reduction of the number of cycles required to form the nucleation layer. A representative tungsten nucleation layer of 100 Angstroms thickness with step coverage of 96% in contacts with an aspect ratio of 12:1 can be produced as follows:

$SiH_4$ 200 sccm for 2 seconds
$WF_6$ 600 sccm for 2 seconds
Hydrogen 7000 sccm
Argon 7000 sccm
Preheat 30 seconds
5 cycles, 42 seconds at 350° C.

According to another aspect of the invention, the purging step between the alternating tungsten and reducing agent dosing is performed by introducing hydrogen or nitrogen gas into the deposition chamber.

According to another aspect of the invention, the pulsed nucleation process is followed by more conventional bulk processing using $H_2$ and/or $SiH_4$ with $WF_6$ (or another tungsten-containing gas) in a CVD process. Thus, the methods of the invention can further comprise the step of depositing tungsten film by CVD atop the nucleation layer by contacting the nucleation layer with $SiH_4$ and/or $H_2$ simultaneously with $WF_6$ under suitable conditions to deposit a tungsten film.

Furthermore, a soak step could be implemented subsequent to the pulsed nucleation process and prior to the CVD process as described above. The soak step can comprise of substrate exposure to gases such as $N_2$, $H_2$, $O_2$, $Si_2H_6$, $B_2H_6$, or a combination thereof in a gaseous or plasma state.

If a multi-station reactor that enables parallel processing of multiple wafers is used, the alternating reactant deposition process may occur on some stations, simultaneous $WF_6$—$SiH_4$ CVD on other stations after completion of alternating deposition process, and then simultaneous $WF_6$—$H_2$ CVD on the final deposition stations for complete tungsten fill.

More specifically, wafers that had been subjected to the pulsed alternating deposition methods described herein at the first 1, 2, 3, or more stations of the multi-station deposition system are then moved to a station wherein tungsten is deposited by the reaction of $WF_6$ and $H_2$. The $WF_6$ and $H_2$ gases are simultaneously introduced to achieve excellent gap-fill by chemical vapor deposition at higher rates. In addition, inert gases can also be flowed to the deposition stations. When such a multi-station system is used, the deposition temperatures can be independently optimized for the alternating-process deposition described herein or for subsequent steps involving $WF_6$—$SiH_4$ CVD and/or $WF_6$—$H_2$ CVD. This process can be formed on some but not all of the pedestals of the multi-station system with hydrogen and $WF_6$ gases flowing simultaneously onto the other pedestals.

As one of skill will appreciate, this process can be performed with continuous hydrogen and/or nitrogen flow during both dosing and purging As one of skill may appreciate, it may be advantageous to have an additional $SiH_4$ dose step after the final dosing with the tungsten-containing gases to protect subsequent layers from residual tungsten residue in the chamber.

According to another aspect of the invention, the pulsed nucleation layers of the invention can serve as a seed layer for subsequent deposition of Cu or other metals. Likewise, formation of the pulsed nucleation layer can be followed by preparation of a barrier layer. For example, the methods of the invention can further comprise the step of depositing a tungsten barrier film by CVD atop the nucleation layer by contacting the nucleation layer with diborane, and optionally silane, simultaneously with $WF_6$ under suitable conditions to deposit the tungsten film.

Further, it will be recognized by those skilled in the art that a variety of techniques of forming interconnect, such as the single or dual damascene technique, or other traditional techniques of forming low resistance contacts or plugs which involve filling an opening with conductive materials such as tungsten or aluminum may be used to practice the present invention. Moreover, it should be understood that the present invention is applicable to forming a seed layer in a contact and/or a via atop a conductive or a doped region formed on a semiconductor substrate.

Deposition Chamber

The methods of the invention may be carried out in a Novellus Altus CVD chamber, the Concept 2 Altus chamber, the Concept 3 Altus processing chamber, or any of a variety of other commercially available CVD tools. More specifically, the process can be performed on multiple deposition stations in parallel. See, e.g., U.S. Pat. No. 6,143,082, which is incorporated herein by reference for all purposes. In some embodiments of the present invention, the pulsed nucleation process is performed at a first station that is one of five or more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface. After nucleation of the tungsten film is complete, the gases are turned off. The semiconductor substrate, having a first thickness of tungsten deposited at a first rate, is then moved to a second deposition station and a new wafer is moved into place on the first station. The wafers may be indexed from one deposition station to the next to enable parallel wafer processing after one or more repetitions of the cycle. The full thickness of the tungsten film is achieved by additional cycles with alternating reducing gases and tungsten-containing gases at one or more of the other deposition stations. This is repeated until all substrates are coated to the desired thickness. It is the sum of these individual depositions that forms the total amount of W nucleation layer deposited. Any number of deposition stations, each capable of having a localized atmosphere isolated from adjacent stations, is possible within the single chamber.

The invention also provides for a deposition chamber in which alternating deposition stations are dedicated to deliver either tungsten-containing gases or reducing gases. More specifically, the deposition stations in the chamber are separated into two groups with the first group dedicated to delivery of the reducing gases and the second group for introducing tungsten containing gas. These stations also can provide for the simultaneous delivery of inert gases with the dedicated gases. Thus, tungsten is deposited by moving wafers from station to station such that the wafer is sequentially exposed to the reducing gases and then the tungsten-containing gases until the desired thickness of tungsten is obtained.

Another aspect of the invention provides for a module for alternating deposition of tungsten containing one or more of the following design elements:

a plurality of deposition stations comprising a showerhead or dispersion plate for uniform gas introduction paired with a heated pedestal that holds a wafer underneath the showerhead;

a plurality of deposition stations with showerheads flush-mounted with the top of the module vacuum chamber to minimize gas re-circulation in the module and promote efficient purging between alternating deposition steps;

a fully purged top plate of the module vacuum chamber consisting of a purge gas plenum covering the top plate area not occupied by deposition showerheads wherein improved station-to-station isolation and reduced purge times between deposition cycles are obtained; or a vacuum chamber in which the heated pedestals from each deposition station are completely or partially isolated from each other by an annular pumping ring connected to the chamber exhaust. This feature further enhances station-to-station isolation and enables different processes to be run simultaneously on alternate stations in the same module.

The module may further comprise means, provided to each showerhead, for creating a RF plasma in between the showerheads and the substrate platens. Preferably, such means comprise an RF energy source, a match network, and the necessary electrical connections. In another embodiment, the module may further comprise means for creating a microwave plasma in the chamber.

Figure 5:
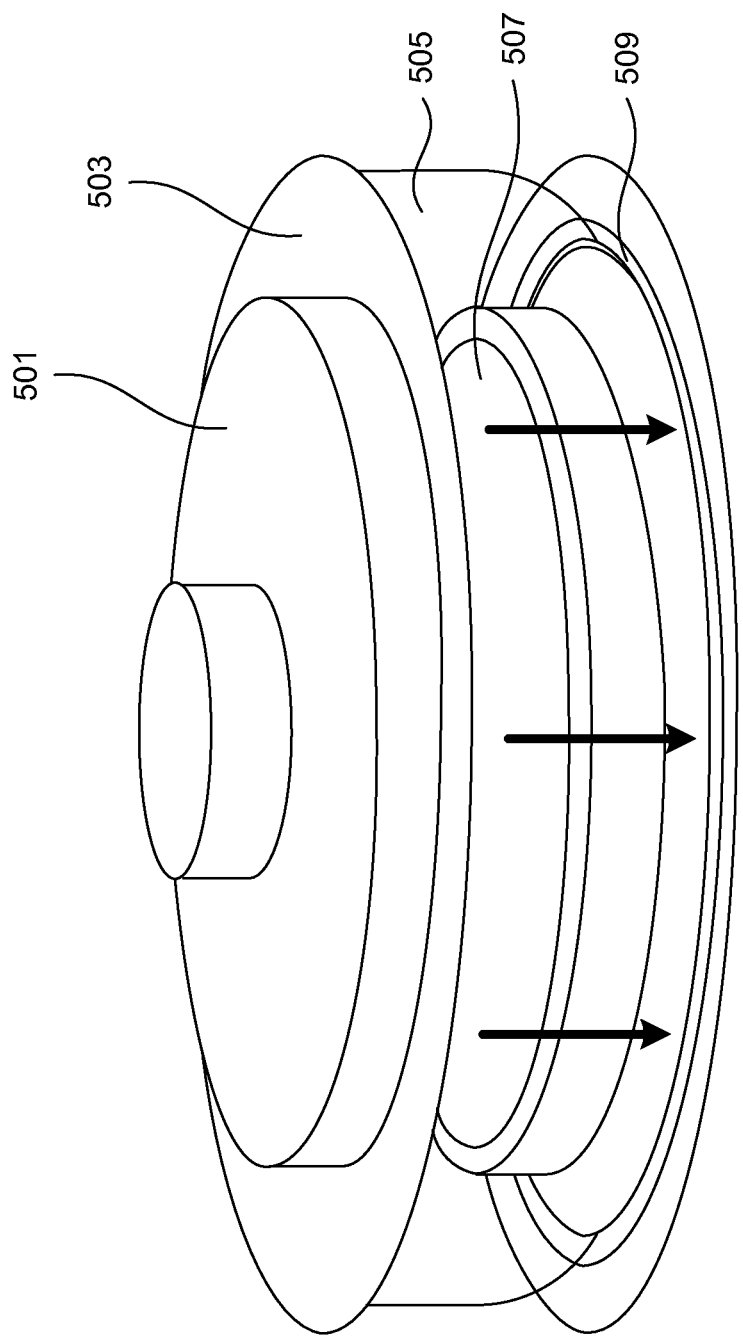
FIG. 5 shows a schematic representation of a deposition station module having a flush-mounted showerhead 501, a fully purged top plate 503, and an annular pumping port 509. Wafer 507 is surrounded by an inert gas curtain 505.

A representative example of such a module having a flush-mounted showerhead, a fully purged top plate, and an annular pumping port is shown in FIG. 5.

As will be appreciated in the art, each such deposition station will typically have a heated substrate platen for holding and heating a substrate to a predetermined temperature. In addition, each typically will have a backside gas distribution system to prevent deposition of the W film on the backside of the substrate, and a vacuum clamping manifold for clamping the substrate to the platen. Finally, the deposition chamber can be equipped with a transport system for transporting wafers or substrates into and out of the chamber as well as between deposition stations.

Figure 4:
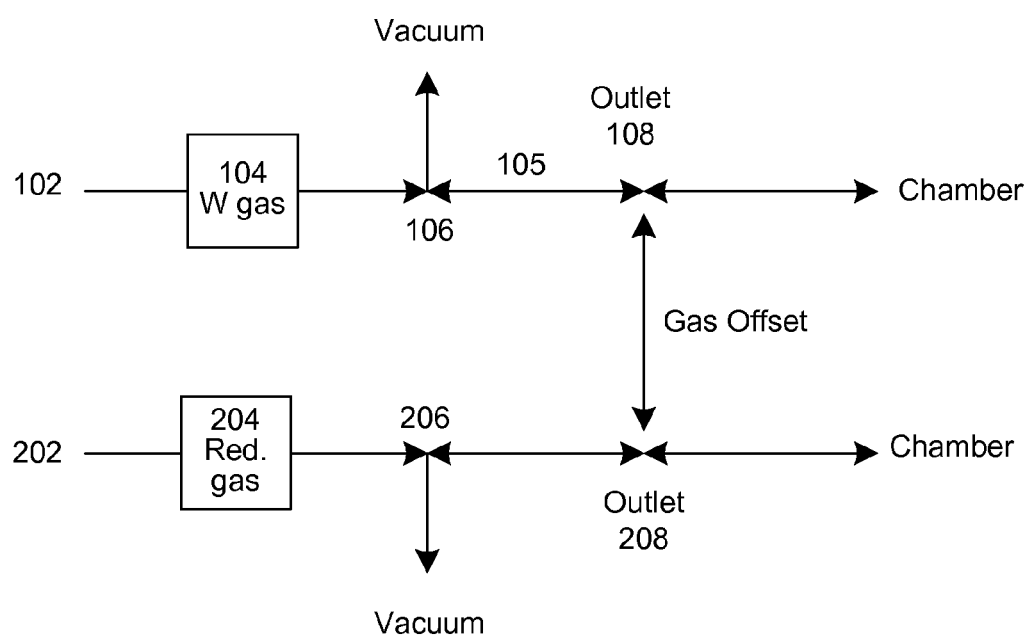
FIG. 4 shows a schematic representation of an embodiment of the dual divert gas box.

The invention also provides for a gas manifold system which may be used to provide line charges to the various gas distribution lines as shown schematically in FIG. 4. Manifold 104 has an input 102 from a source of the tungsten-containing gas (not shown), and manifold 204 has an input 202 from a source of the reducing gas (not shown). The manifolds, 104 and 204, provide the tungsten-containing gas and reducing gases to the deposition chamber through valved distribution lines, 105 and 205, respectively. The various valves are opened or closed to provide a line charge, i.e., to pressurize the distribution lines. More specifically, to pressurize distribution line 105, valve 106 is closed to vacuum and valves 108 is closed. After a suitable increment of time, valve 108 is opened (valve 208 is closed) and the tungsten-containing gas is delivered to the chamber. Again, after a suitable time for delivery of the gas, valve 108 is closed. The chamber can then be purged to a vacuum by opening of valves 106 to vacuum.

A similar process is used to deliver the reducing gas. For example, the line is charged by closing valve 208 and closing valve 206 to vacuum. Opening of valve 208 allows for delivery of the reducing gas to the chamber. It has been found that the amount of time allowed for line charges changes the amount and timing of the initial delivery of the gas.

FIG. 4 also shows vacuum pumps wherein valves 106 and 206, respectively, can be opened to purge the system. The supply of gas through the various distribution lines is controlled by a controller, such as a mass flow controller which is

What is claimed is:

1. A method of forming a tungsten film on a surface of a semiconductor substrate, the method comprising:
   positioning said semiconductor substrate within a deposition chamber;
   prior to forming any tungsten on the substrate surface, performing an initiation soak, which comprises exposing the surface to a boron-containing compound;
   exposing the substrate to a tungsten-containing gas that is reduced to form a first portion of a tungsten nucleation layer on the substrate;
   after forming the first portion of the tungsten-nucleation later, flowing a silane into said deposition chamber; and
   flowing a tungsten-containing gas into said deposition chamber and reducing the tungsten-containing gas to form another portion of the tungsten nucleation layer, wherein said deposition chamber has multiple stations and
   wherein one or more stations is used for pulsed nucleation to form the nucleation layer and the remainder of the stations are used for CVD plugfill.

2. The method of claim 1, wherein said tungsten-containing gas comprises $WF_6$, $WCl_6$, or $W(CO)_6$.

3. The method of claim 1, wherein said tungsten-containing gas further comprises argon, hydrogen, nitrogen, or a combination thereof.

4. The method of claim 1, further comprising the step of purging said tungsten-containing gas.

5. The method of claim 4, wherein the steps are repeated until the desired thickness of said tungsten nucleation layer is obtained.

6. The method of claim 1, further comprising:
   treating said substrate with $SiH_4$, $Si_2H_6$, $B_2H_6$, $N_2$, $O_2$, $H_2$, an inert gas, or a combination thereof in a gaseous or plasma state.

7. The method of claim 1, further comprising:
   repositioning said semiconductor substrate to a second deposition station;
   providing a second reducing gas to said surface; and
   providing a second tungsten-containing gas to said surface to provide a second tungsten film, wherein said second tungsten film is at least about one monolayer thick.

8. The method of claim 1, further comprising:
   repositioning said semiconductor substrate to a second deposition station, wherein said substrate has a nucleation layer of the desired thickness; and
   contacting the substrate with a tungsten-containing gas and a reducing gas under CVD conditions.

9. A method of forming a tungsten film on a surface of a semiconductor substrate, the method comprising:
   positioning said semiconductor substrate within a deposition chamber;
   prior to forming any tungsten on the substrate surface, performing an initiation soak, which comprises exposing the surface to a boron-containing compound;
   exposing the substrate to a tungsten-containing gas that is reduced to form a first portion of a tungsten nucleation layer on the substrate;
   after forming the first portion of the tungsten-nucleation later, flowing a silane into said deposition chamber; and
   flowing a tungsten-containing gas into said deposition chamber and reducing the tungsten-containing gas to form another portion of the tungsten nucleation layer, wherein said deposition chamber has multiple stations and wherein the substrate is preheated at a first station and then repositioned to a second station for said initiation soak step.

10. The method of claim 1, wherein the pressure of the deposition chamber is maintained at more than about 1 Torr.

11. A method of forming a tungsten film on a surface of a substrate in a deposition chamber, the method comprising:
   (a) prior to forming any tungsten on the substrate surface, exposing the surface to an initial dose of a boron-containing compound;
   (b) exposing the substrate to a tungsten-containing gas that is reduced to form a first portion of a tungsten nucleation layer on the substrate;
   (c) after forming the first portion of the tungsten nucleation layer, contacting the substrate with a silane;
   (d) exposing the tungsten-containing gas to thereby reduce the tungsten-containing gas to form another portion of the tungsten nucleation layer on the semiconductor substrate, and further comprising repeating (c) and (d) for more one or more additional cycles.

12. The method of claim 11, wherein the substrate temperature is between about 250° C. to 350° C.

13. The method of claim 11, wherein the one or more additional cycles complete deposition of the tungsten nucleation layer.

14. The method of claim 11, further comprising depositing a bulk tungsten layer on the tungsten nucleation layer by contacting the substrate with a tungsten-containing gas and hydrogen under chemical vapor deposition (CVD) conditions.

15. The method of claim 11, wherein the deposition chamber has a single station.

16. The method of claim 11, wherein the deposition chamber has multiple stations.

17. The method of claim 11, wherein the boron-containing compound is diborane.

18. The method of claim 11, wherein the silane compound is silane or disilane.

* * * * *